United States Patent
Liu et al.

(10) Patent No.: US 11,562,917 B2
(45) Date of Patent: Jan. 24, 2023

(54) WAFER POSITIONING METHOD AND A SEMICONDUCTOR MANUFACTURING APPARATUS

(71) Applicant: Zing Semiconductor Corporation, Shanghai (CN)

(72) Inventors: Liying Liu, Shanghai (CN); Gongbai Cao, Shanghai (CN); Chihhsin Lin, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 153 days.

(21) Appl. No.: 17/135,836

(22) Filed: Dec. 28, 2020

(65) Prior Publication Data

US 2021/0335637 A1 Oct. 28, 2021

(30) Foreign Application Priority Data

Apr. 27, 2020 (CN) .......................... 202010345053.2

(51) Int. Cl.
*G06T 7/77* (2017.01)
*H01L 21/67* (2006.01)
(Continued)

(52) U.S. Cl.
CPC ........ *H01L 21/67259* (2013.01); *H01L 21/68* (2013.01); *H01L 22/20* (2013.01)

(58) Field of Classification Search
CPC .... G06T 7/40; G06T 7/41; G06T 7/70; G06T 7/77
See application file for complete search history.

(56) References Cited

U.S. PATENT DOCUMENTS

| 2004/0159284 A1 | 8/2004 | Sakamoto et al. |
| 2007/0131537 A1 | 6/2007 | Sakamoto et al. |
| (Continued) |

FOREIGN PATENT DOCUMENTS

| CN | 102110628 A | 6/2011 |
| EP | 1429375 A1 | 6/2004 |
| (Continued) |

OTHER PUBLICATIONS

Taiwanese Office Action, dated Mar. 25, 2021, in a counterpart Taiwanese patent application, No. TW 109137048.
(Continued)

*Primary Examiner* — Jae Lee
(74) *Attorney, Agent, or Firm* — Chen Yoshimura LLP (57) ABSTRACT

The invention provides a method for positioning a wafer and a semiconductor manufacturing apparatus, which are applied to thin film processes. The method includes: Step S1: Obtain the state distribution of the first surface of the first wafer after the thin film process is performed on the first wafer, wherein the first surface is the surface opposite to a surface that the thin film formed thereon in the thin film process; Step S2: Determine whether the first wafer is located at the ideal positioning center according to the state distribution of the first surface, when the first wafer is not located at the ideal positioning center, according to the state distribution of the first surface adjusts the positioning position of the second wafer to be subjected to the thin film process, so that the second wafer is positioned at the ideal positioning center during the thin film process. According to the present invention, the wafer is positioned at the ideal positioning center during the thin film process, thereby improving the quality of the thin film layer and the entire wafer (epitaxial wafer) after the thin film process, and improving the effect of the thin film process.

8 Claims, 3 Drawing Sheets

```
obtaining a state distribution of a first surface of a first wafer      S1
after the thin film process performed on the first wafer,
wherein the first surface is the surface opposite to a surface
that the thin film formed thereon in the thin film process; and determining whether the first wafer is located at an ideal             S2
positioning center according to the state distribution of the first
surface; when the first wafer is not located at the ideal positioning
center, a positioning position of a second wafer to be subjected to
the thin film process is adjusted according to the state distribution
of the first surface to position the second wafer at the ideal
positioning center during the thin film process.
```

(51) Int. Cl.
    *H01L 21/68*       (2006.01)
    *H01L 21/66*       (2006.01)

(56) References Cited

U.S. PATENT DOCUMENTS

| | | |
|---|---|---|
| 2008/0080845 A1 | 4/2008 | Chen et al. |
| 2011/0073037 A1* | 3/2011 | Ohnishi ............ H01L 21/68735 118/641 |
| 2019/0378739 A1* | 12/2019 | Kiyotomi .......... H01L 21/67253 |

FOREIGN PATENT DOCUMENTS

| | | |
|---|---|---|
| JP | 2003037075 A | 2/2003 |
| JP | 2014-127595 A | 7/2014 |

OTHER PUBLICATIONS

Japanese Office Action, dated Feb. 22, 2022 in a counterpart Japanese patent application, No. JP 2020-219268.
German Office Action, dated Nov. 29, 2022, in a counterpart German patent application, No. DE 102020134992.0.

\* cited by examiner

WAFER POSITIONING METHOD AND A SEMICONDUCTOR MANUFACTURING APPARATUS

BACKGROUND OF THE INVENTION

1. Field of the Invention

The present invention relates to semiconductor technology, in particular, to a wafer positioning method and a semiconductor manufacturing apparatus.

2. Description of the Related Art

Thin film process is broadly applied to semiconductor manufacturing processes, which is to form a thin film layer on a semiconductor substrate and includes oxidation process, epitaxy process, deposition process and the like.

Silicon epitaxial wafer is the most important material for integrated circuit. It is broadly applied to micro processor unit (MPU), logic circuit chip, flash memory, dynamic random access memory (DRAM) and the like. The silicon epitaxial wafer is more advantageous than polishing wafer in yield and property enhancement of electronic device.

In a typical manufacturing process of silicon epitaxial wafer, a silicon substrate wafer is placed on a base within an epitaxial furnace, and the epitaxial growth is generally conducted under 1100° C.-1150° C. with an ambience of TCS, HCl and a dopant. The thickness of the epitaxy layer varies corresponding to the positions on the base. Ensuring the wafer positioned at the center of the base can improve the outcomes of the epitaxy process including uniformity of thickness of the epitaxy layer, uniformity of resistivity of the epitaxy layer, flatness of the epitaxy wafer and the like.

Currently, the conventional method for positioning the wafer on the base includes transferring the silicon wafer by a mechanical arm of a transferring device into an epitaxial chamber, observing the distance between the silicon wafer and the edge of base by naked eye to determine whether the wafer is positioned at the center of the base. The conventional method has at least two disadvantages illustrated as follows.
1. It can be merely conducted while the light within the chamber is on. However, to turn on the light within the chamber, it is required to turn off the chamber and decrease temperature. The routine manufacture process is delayed thereby.
2. In the actual epitaxial process, the wafer is generally loaded onto the base under high temperature such as 700° C. Since the gas flow and the temperature field of the chamber under high temperature are different from that under room temperature, the wafer's loading position in the actual process is different from the positioning position predicted under room temperature. Thereby, the best positioning position of the wafer cannot be satisfied during the manufacturing process.

Therefore, the present application provides a wafer positioning method and a semiconductor manufacturing apparatus to solve the above problems.

SUMMARY

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

To solve the problems of the conventional technical, the present application provides a method for positioning a wafer, which is applied to a thin film process, comprising:

Step S1: obtaining a state distribution of a first surface of a first wafer after the thin film process performed on the first wafer, wherein the first surface is the surface opposite to a surface that the thin film formed thereon in the thin film process; and Step S2: determining whether the first wafer is located at an ideal positioning center according to the state distribution of the first surface; when the first wafer is not located at the ideal positioning center, a positioning position of a second wafer to be subjected to the thin film process is adjusted according to the state distribution of the first surface to position the second wafer at the ideal positioning center during the thin film process.

In one embodiment, the state distribution of the first surface comprises a backside Z height double derivative (BZDD) distribution of the first surface.

In one embodiment, the BZDD distribution of the first wafer surface is obtained by the step comprising:
detecting a height of the first surface at a position having a distance from the first wafer center with a radius direction, and obtaining a height data of the first surface with various distances and various radius directions; and
calculating the ZDD distribution of the first surface at various radius directions based on the height data.

In one embodiment, the step to adjust the positioning position of the second wafer according to the state distribution of the first surface comprises:
obtaining a minimum value of the ZDD distribution of the first surface at each radius direction;
obtaining a radar chart of the ZDD distribution of the first surface based on a diameter distance between a position having the minimum value of the ZDD distribution and the first wafer center at each radius direction, wherein the radar chart illustrates a distance between the position having the minimum value of the ZDD distribution and the ideal positioning center at each radius direction;
determining whether the first wafer is located at the ideal positioning center according to the radar chart of the ZDD distribution; and
wherein the positioning position of the second wafer is adjusted according to the radar chart of the ZDD distribution when the first wafer is not located at the ideal positioning center.

In one embodiment, the step to adjust the positioning position of the second wafer to be subjected to the thin film process according to the state distribution of the first surface comprises:
obtaining a center of the first wafer according to the radar chart of the ZDD distribution;
comparing the obtained center of the first wafer with the ideal positioning center to obtain a biasing vector of the first wafer center from the ideal positioning center; and
adjusting the positioning position of the second wafer during the thin film process according to the vector.

The radius direction is a direction from the center toward the periphery of the first wafer. In one embodiment, the radius direction comprises multiple radius directions formed by plural points set on the wafer periphery with an equal interval between these points.

In one embodiment, the position having a distance from the first wafer center with a radius direction comprises multiple positions set on the radius direction with an equal interval between each other, in each radius direction.

In one embodiment, the thin film process comprises an epitaxy process and/or a deposition process.

The present application also provides a semiconductor manufacturing apparatus, which is applied to a thin film process, comprising:
a wafer carrier for carrying a wafer during the thin film process; and
a positioning device for positioning the wafer at an ideal positioning center on the wafer carrier, and comprising a processor and an executable program instruction, wherein the positioning device performs the method of any of the above methods when the processor performs the executable program instruction.

In one embodiment, the apparatus further comprises a transferring device for transferring the wafer to the wafer carrier; wherein, in the Step S2, the step to adjust the positioning position of the second wafer according to the state distribution of the first surface comprises adjusting the transferring device according to the state distribution of the first surface.

According to the present application, the state distribution of the wafer surface is detected after the thin film process, in which the wafer surface is opposite to a surface that the thin film formed thereon in the thin film process. The wafer position is then adjusted accordingly. It is able to achieve the adjustment of wafer position in the chamber under the process temperature, so that the wafers can be positioned at the ideal positioning center during the thin film process. The quality of the thin film layer and the whole wafer (i.e. epitaxy wafer) can be increased, and the outcomes of the thin film process can be improved.

DETAILED DESCRIPTION OF THE EMBODIMENTS

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure.

It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

EXAMPLES

Example 1

To solve the problems of the conventional technical, the present application provides a method for positioning a wafer, which is characterized to be applied to a thin film process, comprising:
Step S1: obtaining a state distribution of a first surface of a first wafer after the thin film process performed on the first wafer, wherein the first surface is the surface opposite to a surface that the thin film formed thereon in the thin film process; and
Step S2: determining whether the first wafer is located at an ideal positioning center according to the state distribution of the first surface;
when the first wafer is not located at the ideal positioning center, a positioning position of a second wafer to be subjected to the thin film process is adjusted according to the state distribution of the first surface to position the second wafer at the ideal positioning center during the thin film process.

Since it is required to decrease temperature of the chamber to a room temperature in the conventional wafer positioning method, the routine manufacture process is significantly delayed. Also, the actual process temperature within the chamber is generally high. e.g. 700° C., causing the change of the wafer position predicted at room temperature. Thereby, the ideal positioning position of the wafer cannot be satisfied during the manufacturing process. The wafer positioning method of the present application is able to achieve the wafer position under the process temperature, and prevents from temperature decrease of the chamber. The wafer positioning can be conducted with high efficiency, time reduction and high accuracy. Accordingly, the quality of the thin film on the wafer can be increased, and the outcomes of the thin film process can be improved.

Figure 1:
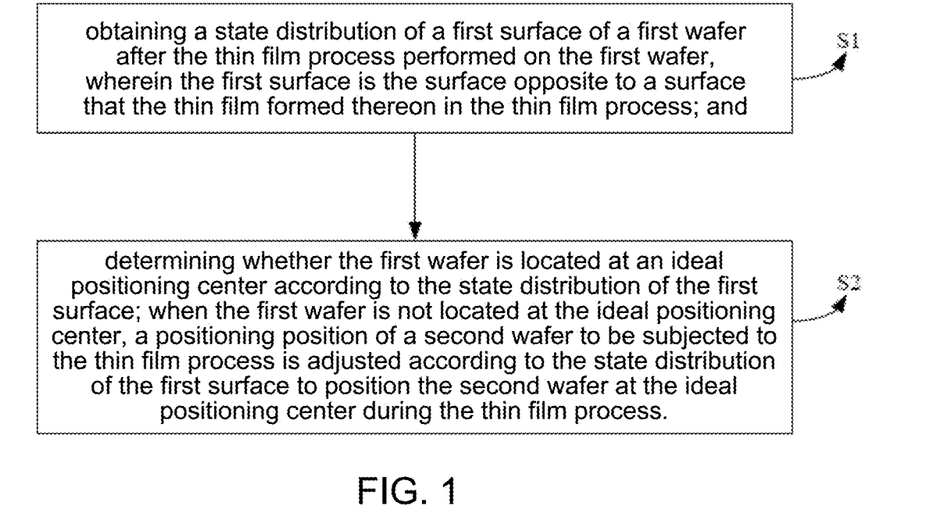
FIG. 1 is a flow chart illustrating a method for positioning a wafer in accordance with one embodiment of the present application.
Figure 2:
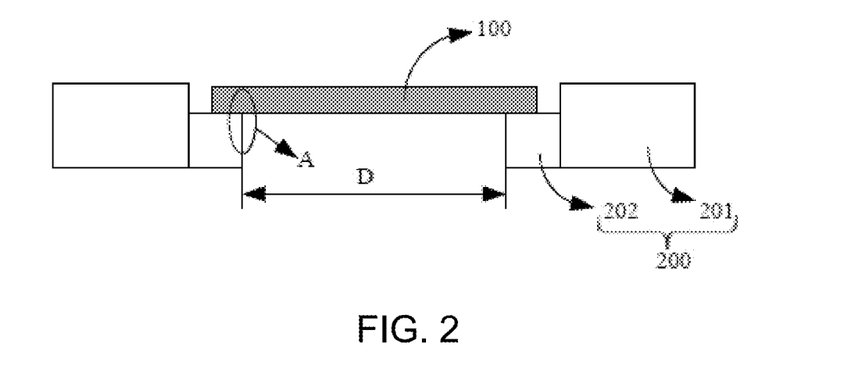
FIG. 2 is a schematic view illustrating a structure of a base in a semiconductor manufacturing apparatus in accordance with one embodiment of the present application.
Figure 3A:
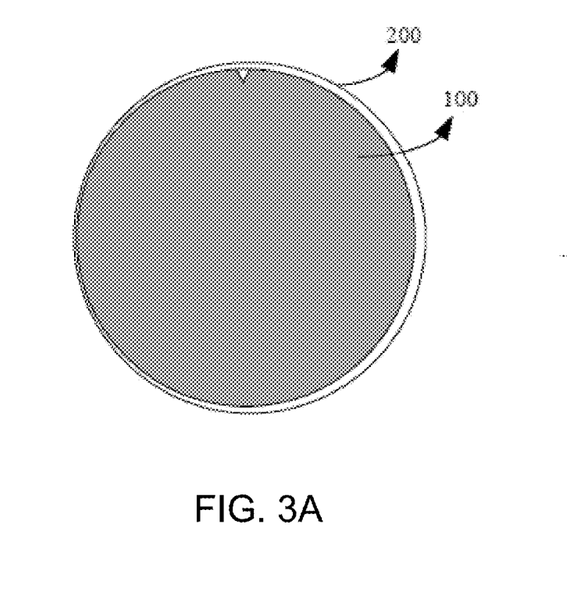
FIGS. 3A and 3B are radar charts of ZDD distribution on a first wafer in accordance with one embodiment of the present application.
Figure 3B:
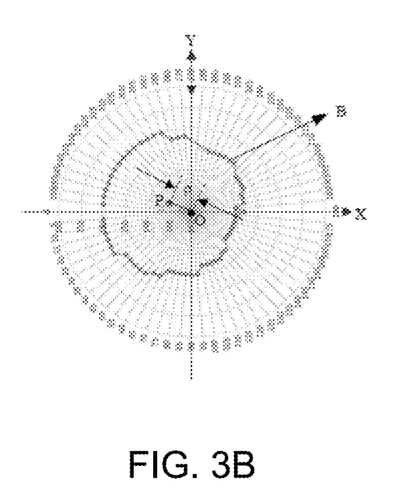
Figure 4A:
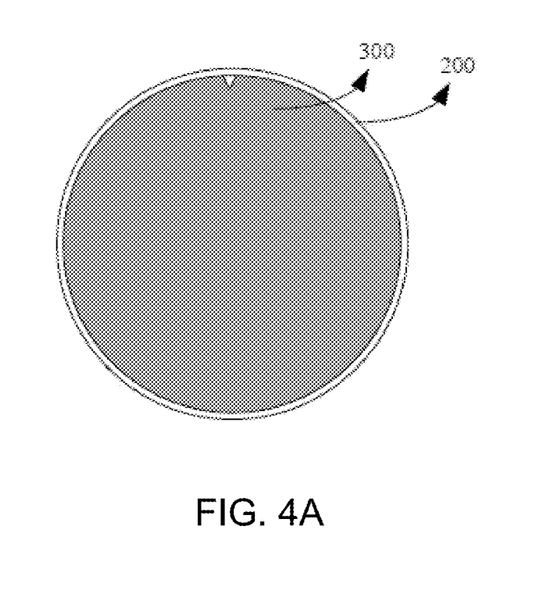
FIGS. 4A and 4B are radar charts of ZDD distribution on a second wafer in accordance with one embodiment of the present application.
Figure 4B:
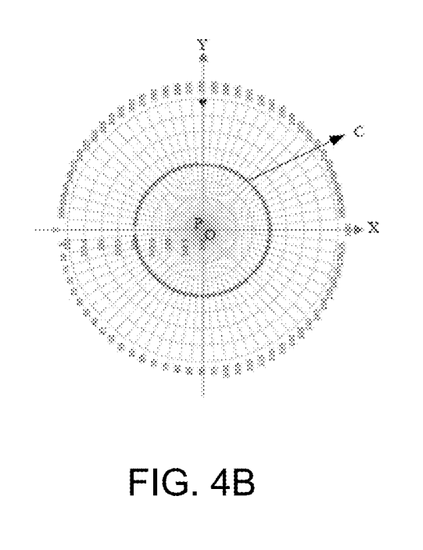

The method for positioning a wafer of the present application is described illustratively by referring FIGS. 1, 2, 3A-3B and 4A-4B. FIG. 1 is a flow chart illustrating a method for positioning a wafer in accordance with one embodiment of the present application. FIG. 2 is a schematic view illustrating a structure of a base in a semiconductor manufacturing apparatus in accordance with one embodiment of the present application. FIGS. 3A and 3B are radar charts of ZDD distribution on a first wafer in accordance with one embodiment of the present application. FIGS. 4A and 4B are radar charts of ZDD distribution on a second wafer in accordance with one embodiment of the present application.

Referring FIG. 1, it conducts the step S1: obtaining a state distribution of a first surface of a first wafer after the thin film process performed on the first wafer, wherein the first surface is the surface opposite to a surface that the thin film formed thereon in the thin film process.

In the semiconductor manufacture process, the thin film process generally includes oxidation process, deposition process and epitaxy process. In the present application, the thin film process includes deposition process and/or epitaxy process. In the deposition process and the epitaxy process, the wafer is placed under an atmosphere of chemicals with certain environmental conditions, the chemical deposits on the wafer surface and grows to be a thin film. The deposition and the growth of the thin film are very sensitive to the wafer surface state. Because the state distribution of the wafer is affected by different positioning position, the state and quality of the thin film formed on the wafer and the whole wafer is affected thereby. It needs to accurately positioning the wafer at an ideal positioning center during the thin film process.

In the thin film process, because of the affection of the wafer loading device, i.e. the base, within the processing chamber, various state distribution are formed on the wafer surface opposite to the film-forming surface after the thin film process. In one embodiment, the wafer edge generally has various distributions because the wafer is loaded on and affected by the wafer loading device. Based on this character, the present application is to adjust the wafer positioning position based on the detection results of state distribution of the first surface of the wafer, in which the first surface is the surface opposite to the thin-film-formed surface. It is able to adjust the wafer positioning position under the process temperature, make the wafer be positioned at the ideal positioning center during the thin film process, and improve the outcomes of the thin film process including uniformity of the film thickness, uniformity of the resistivity and flatness of the whole wafer (epitaxy wafer) such as SFRQ.

Referring FIG. 2, the schematic view of a typical wafer loading device used in thin film process is illustrated. In a typical epitaxial process, a processing chamber of an epitaxial apparatus includes a base 200 for carrying a wafer 100, and the base 200 includes a first part 201 and a second part 202. The second part 202 has an inner diameter D slightly less than the wafer diameter, which is applied to support the wafer during the thin film process and cool the wafer. In the thin film process, the second part 202 contacts the edge of the first surface of the wafer, i.e. the surface opposite to the thin-film-formed surface of the wafer, causing various affections on the heated states of the first surface of the wafer 100, and, thereby the state of the first surface of the wafer 100 is affected.

In the present application, based on the state distribution of the first surface of the first wafer, it determines whether the positioning of the first wafer is accuracy, and provides an indication for the following wafer positioning to effectively enhance the positioning precision. At the same time, the adjustment is based on calculation and without determination by naked eye, and can be conducted under the processing conditions of the thin film process. It prevents from the problems that the positioning has to be conducted under shutdown of the processing chamber, and the best positioning cannot be achieved because of the variation of the positioning between room temperature and processing temperature. Further, in the present application, since the positioning method is based on the state of the first surface but not the surface state of the thin film layer, the affections of the thin film process itself on the film uniformity can be eliminated, and the precision of the wafer positioning can be enhanced.

In embodiments, the first wafer comprises at least one wafer. The first wafer comprises any one or plural wafers that have been subjected to the thin film process. For example, in the continuous thin film process, the positioning is conducted for positioning the first box of wafers, the thin film process is conducted for the first box of wafers, and the state distribution of the first surface of any one or plural wafers in the first box are obtained after the thin film process for the first box. Or, the state distribution of the first surface of the first wafers that have been subjected to the thin film process is obtained prior to the thin film process of the second wafer.

In one embodiment, the state distribution of the first wafer comprises BZDD (Backside Z height Double Derivative) distribution of the surface of the first wafer. BZDD distribution is obtained by detecting the height of wafer surface, calculating a second derivative from the height, and obtaining a height distribution data of wafer back surface. After the thin film process such as epitaxy process, the value of BZDD distribution of the substrate wafer surface at the position that the wafer contacting the second part 202 is smallest. It may be affected by such as cooling of the second part 202 of the base 200. The position that the wafer contacting the second part 202 is indicated by the circle A in FIG. 2. Based on the distribution of the smallest values of BZDD distribution on the wafer surface along with the direction of wafer periphery, it can determine whether the wafer is positioned at the center of the second part 202, i.e. the ideal positioning center, during the thin film process.

It should be emphasized that, in this example, the applied BZDD distribution relating to the height of the first surface is merely illustrative example. A person having ordinary skills in the art understands that any means reflecting distribution state of the first surface of the wafer, such as thickness uniformity, resistivity uniformity and flatness such as SFQR, can be applied to the present application to obtain equivalent effects.

In one embodiment, the method for obtaining the BZDD distribution of the first wafer surface includes:

Step S21: detecting a height of the first surface at a position having a distance from the first wafer center with a radius direction, and obtaining a height data of the first surface with various distances and various radius directions;

Step S22: calculating the ZDD distribution of the first surface at various radius directions based on the height data.

The radius direction is a direction from the center toward the periphery of the first wafer. In one embodiment, the radius direction comprises multiple radius directions. The radius directions are formed by plural points set on the wafer periphery with an equal interval between these points, meaning that the identical angle is formed by any two neighboring radius directions. In one embodiment, the angle formed by two neighboring radius directions is 5°, so that a total of 72 radius directions are set.

In one embodiment, the position having a distance from the first wafer center with a radius direction comprises plural positions. The positions are set on one radius direction with an equal interval between any two neighboring positions. Every radius direction can have plural positions. In one embodiment, the interval is 0.2 mm the positions to be detected on each radius direction, The above numbers of the radius direction and the position are exemplified illustratively and without limitation, and any number of the radius direction and the position can be applied as long as the distribution state of the first wafer surface can be reflected.

After obtaining the height data with various radius directions and various distances on the first surface, the ZDD (also known as BZDD) distribution of the height of the first surface of the first wafer with different radius directions is calculated. In one embodiment, the following steps are included.

Step S221: The average height, Zavg (R), of the positions that have same distance from the first wafer center to the position in every radius direction θ are calculated.

Step S222: Based on the average height Zavg and the distance R from the first wafer center to the position, S=dZavg(R)/dR is used to obtain a radial slope, S. In this step, Matlab software can be applied to the fitting.

Step S223: ZDD is calculated, wherein, $$ZDD(R) = \frac{\partial^2 Zavg(R)}{\partial R^2}.$$

From the above calculations, the ZDD value at various position of the first surface of the first wafer can be obtained, and, the ZDD (BZDD) distribution of height of the first surface of the first wafer can be further obtained. Based on BZDD distribution, it can determine whether the center of the first wafer is the center of circle to be surrounded by the above first surface heights, thereby it can determine whether the first wafer is located at the center of the base, i.e. the ideal positioning center, during the thin film process.

Continuously referring FIG. 1, Step S2 is conducted. It determines whether the first wafer is located at an ideal positioning center according to the state distribution of the first surface. When the first wafer is not located at the ideal positioning center, a positioning position of a second wafer to be subjected to the thin film process is adjusted according to the state distribution of the first surface to position the second wafer at the ideal positioning center during the thin film process.

To determine whether the first wafer is located at an ideal positioning center, the determination steps based on the ZDD distribution are illustrated as follows.

In this example, BZDD distribution is applied to the determination steps. However, any state distribution of the first surface of the first wafer can be applied to the present application and achieve the equivalent effects.

Firstly, a minimum value of the BZDD distribution of the first wafer at each radius direction is obtained.

In one embodiment, the BZDD distribution is affected by the second part 202 of the base 200 such as the factor of cooling, namely, the distribution state of the first surface at the edge of the first wafer is affected. Accordingly, it only screens and analyzes the height of the first surface at the edge of the first wafer for obtaining the BZDD distribution data. For example, the first wafer 100 has a diameter of 300 mm and the second part 202 of the base 200 of the thin film manufacturing apparatus has an inner diameter D of 290 mm. Therefore, the height data of the first wafer 100 at 140-148 mm of radius is used to obtain the BZDD distribution and the minimum value of the BZDD distribution According the positions that have the minimum value of the BZDD distribution in each radius direction, the radar chart of the ZDD distribution of the first wafer surface is produced. The radar chart of the ZDD distribution shows the distance between the positioning center of the first wafer and the position having the minimum value of the BZDD distribution in each radius direction. It should be understood that the center of the first wafer used in the height detection is same as the ideal positioning center of the thin film process, i.e. the center of the first wafer itself. Referring FIG. 3A and FIG. 3B, the radar charts of ZDD distribution on a first wafer in accordance with one embodiment of the present application are shown. FIG. 3A is the top view illustrating the load of the first wafer on the base. FIG. 3B is the radar chart of ZDD distribution of the first wafer according to FIG. 3A. As shown in FIG. 3B, each point is the position having the minimum value of the BZDD distribution in each radius direction and shows the distance between the position and the ideal positioning center O, i.e. the center of the first wafer itself.

According to the radar charts of ZDD distribution, it determines whether the first wafer is located at an ideal positioning center. When the first wafer is not located at the ideal positioning center, a positioning position of the second wafer to be subjected to the thin film process is adjusted according to the radar charts of ZDD distribution. The radar charts of ZDD distribution shows the distribution of the minimum value of the BZDD distribution in various radius direction on the wafer.

As shown in FIG. 3A, the first wafer 100 is not located at the ideal positioning center of the base 200, and the radar charts of ZDD distribution presents an irregular circle, which significantly deviates from the ideal positioning center O of the base 200. Significantly, the first wafer is not located at the ideal positioning center, so that an adjustment for positioning of the second wafer based on the radar charts of ZDD distribution is required.

Similarly, the second wafer comprises at least one wafer. The second wafer comprises one or more wafers to be subjected to the thin film process. For example, in the continuous thin film process, the positioning is conducted for positioning one box of wafers or single wafer. Therefore, after the state distribution of the first surface of the first wafer is obtained from Step S1, the following positioning step for one box of wafers or single wafer can be conducted, which is not limited herein.

Exemplified adjustment of the positioning of the second wafer according to the radar charts of ZDD distribution is explained as follows.

Firstly, the positioning center of the first wafer in the thin film process is obtained from the radar charts of ZDD distribution. Referring FIG. 3A, the positioning center of the first wafer in the thin film process is obtained from the radar charts of ZDD distribution is P. The method for obtaining the positioning center includes image simulation. The image simulation software is applied to simulate the radar charts of ZDD distribution as a circle, and positioning the circle to obtain the center as the positioning center of the first wafer in the thin film process.

It then compares the positioning center of the first wafer in the thin film process with the ideal positioning center to obtain a biasing vector of the first wafer center from the ideal positioning center. In this example, as shown in FIG. 3A, the ideal positioning center is O, and the positioning center of the first wafer in the thin film process is P. Significantly, the actual center P deviates from the ideal positioning center O, and the biasing vector is further obtained. As shown in FIG. 3B, the biasing vector O→P has a length of p and a direction of a reverse angle α with X axis.

The vector O→P is applied to adjust the positioning position of the second wafer in the thin film process. In one embodiment of the present application, the radar charts of ZDD distribution of the second wafer after adjustment of the positioning position is shown in FIG. 4A and FIG. 4B. FIG. 4A is the top view illustrating the load of the second wafer 300 on the base 200. FIG. 4B is the radar chart of ZDD distribution of the second wafer. As shown in FIG. 4B, the radar charts C of ZDD distribution of the second wafer has a circle center P overlapping with the ideal positioning center O, namely, the adjusted center of the second wafer is located at the ideal positioning center.

In one embodiment, the flatness of the thin film on the wafer is detected after completion of the method for positioning the wafer and the thin film process. A sample having a size of 26 mm*8 mm is sampled at 2 mm from the wafer edge and is tested. The flatness SFQR of wafer surface can be improved to 20%-80% by applying the positioning method of the present application.

According to the present application, by detecting the state distribution of the first surface of the first wafer after the thin film process, the adjustment of the wafer positioning can be conducted under the processing temperature. The wafer can be located at the ideal positioning center in the thin film process, thereby the thickness uniformity of the thin film, the resistivity uniformity and the flatness of whole epitaxial wafer such as SFQR can be enhanced.

Example 2

The present application provides a semiconductor manufacturing apparatus, which is applied to a thin film process. The manufacturing apparatus comprises: a wafer carrier for carrying a wafer during the thin film process; and a positioning device for positioning the wafer at an ideal positioning center on the wafer carrier. The positioning device comprises a processor and an executable program instruction stored therein. When the processor performs the executable program instruction, the positioning device performs the method described in Example 1.

Figure 5:
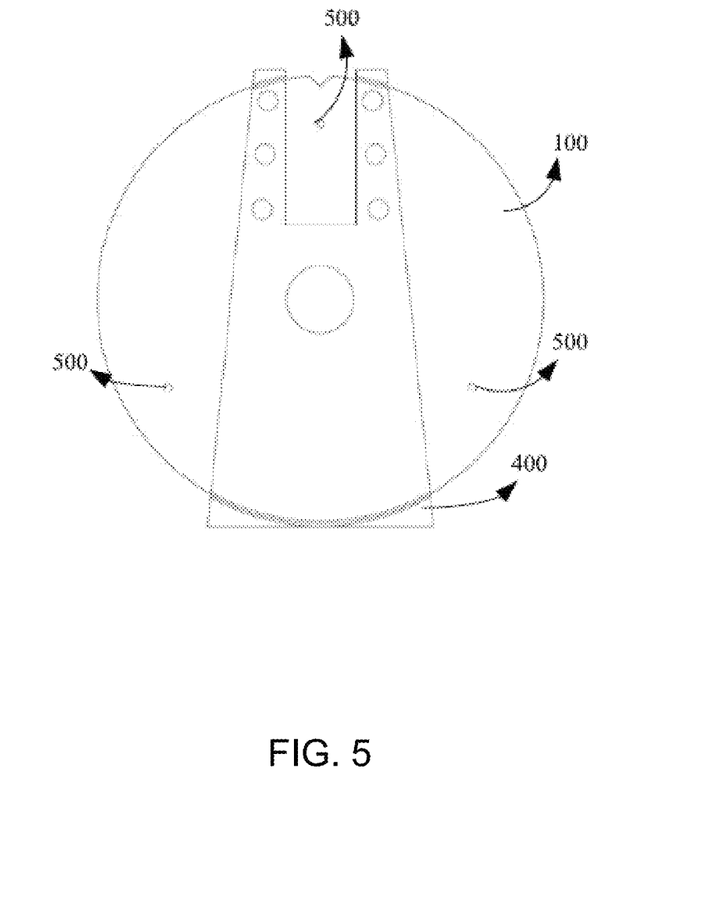
FIG. 5 is a schematic view illustrating a transferring device in a semiconductor manufacturing apparatus in accordance with one embodiment of the present application.

Referring FIG. 2, FIG. 5 and FIG. 3A-FIG. 3B, the exemplified semiconductor manufacturing apparatus is illustrated. FIG. 2 is a schematic view illustrating a structure of a base in a semiconductor manufacturing apparatus in accordance with one embodiment of the present application. FIGS. 3A and 3B are radar charts of ZDD distribution on a first wafer in accordance with one embodiment of the present application. FIG. 5 is a schematic view illustrating a transferring device in a semiconductor manufacturing apparatus in accordance with one embodiment of the present application.

In one embodiment, the wafer loading device includes a base. Referring FIG. 2, the base 200 includes a first part 201 and a second part 202. The first part 201 restricts the wafer on the second part 202. The second part 202 is for supporting the wafer as well as cooling the wafer during the thin film process.

In one embodiment, the semiconductor manufacturing apparatus further includes a transferring device to transfer the wafer to the wafer loading device. The step to adjust the positioning position of the second wafer according to the thickness distribution comprises adjusting the transferring device according to the thickness distribution.

In one embodiment, the transferring device includes a mechanical arm. Referring FIG. 5, the transferring device includes a mechanical arm 400. The wafer 100 is transferred to the base 200 via the mechanical arm 400. The base 200 includes a tri-pen device 500. When the mechanical arm 400 carries the wafer 100 and extends to the above of the base 200, the tri-pen device 500 lifts through the mechanical arm 400 and carries the wafer 100. When the mechanical arm 400 retracts, the tri-pen device 500 drops to place the wafer 100 on the base 200. The extending position of the mechanical arm 400 can be adjusted, and the loading position of the wafer 100 on the base 200 is adjusted thereby. According to the above, the wafer positioning is achieved.

In one embodiment, the step to adjust the positioning position of the second wafer to be subjected to the thin film process according to the state distribution of the first surface of the first surface comprises adjusting the mechanical arm according to the state distribution of the first surface.

In one embodiment, the BZDD distribution is applied to represent as the surface distribution of the first wafer surface. The radar charts of ZDD distribution is produced based on the minimum value of the BZDD distribution in each radius direction. The positioning position of the second wafer is adjusted according the radar charts of ZDD distribution. As shown in FIGS. 3A and 3B, based on the radar charts of ZDD distribution of the first wafer, the biasing vector O→P having a length of ρ and a direction of a reverse angle α with X axis is obtained. Thereby, the position of the mechanical arm is adjusted according to the biasing vector O→P.

In one embodiment, it can adjust the horizontal and/or vertical offset according to the biasing vector O→P, thereby it can adjust the positioning position of the second wafer. For example, based on biasing vector O→P, it calculates and obtains the first wafer as left avertence of 0.07 mm and upward avertence of 0.06 mm. The mechanical arm can be adjusted to right offset of 0.07 mm and downward offset of 0.06 mm. Accordingly, the second wafer can be loaded at the ideal positioning center of the base.

In one embodiment, the flatness of the thin film on the wafer is detected after completion of the method for positioning the wafer and the thin film process. A sample having a size of 26 mm*8 mm is sampled at 2 mm from the wafer edge and is tested. The flatness SFQR of wafer surface can be improved to 20%-80% by applying the positioning method of the present application.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method for positioning a wafer, which is applied to a thin film process, comprising:

Step S1: obtaining a state distribution of a first surface of a first wafer after the thin film process performed on the first wafer, wherein the first surface is the surface opposite to a surface that the thin film formed thereon in the thin film process; wherein the state distribution of the first surface comprises a backside Z height double derivative (BZDD) distribution of the first surface; and Step S2: determining whether the first wafer is located at an ideal positioning center according to the state distribution of the first surface; when the first wafer is not located at the ideal positioning center, a positioning position of a second wafer to be subjected to the thin film process is adjusted according to the state distribution of the first surface to position the second wafer at the ideal positioning center during the thin film process;

wherein the step to adjust the positioning position of the second wafer according to the state distribution of the first surface comprises:

obtaining a minimum value of the ZDD distribution of the first surface at each radius direction;

obtaining a radar chart of the ZDD distribution of the first surface based on a radius distance between a position having the minimum value of the ZDD distribution and the first wafer center at each radius direction, wherein the radar chart illustrates a distance between the position having the minimum value of the ZDD distribution and the ideal positioning center at each radius direction;

determining whether the first wafer is located at the ideal positioning center according to the radar chart of the ZDD distribution; and wherein the positioning position of the second wafer is adjusted according to the radar chart of the ZDD distribution when the first wafer is not located at the ideal positioning center.

2. The method of claim 1, wherein the BZDD distribution of the first wafer surface is obtained by the step comprising: detecting a height of the first surface at a position having a distance from the first wafer center with a radius direction, and obtaining a height data of the first surface with various distances and various radius directions; and calculating the ZDD distribution of the first surface at various radius directions based on the height data.

3. The method of claim 1, wherein the step to adjust the positioning position of the second wafer according to the state distribution of the first surface comprises:

obtaining a center of the first wafer according to the radar chart of the ZDD distribution;

comparing the obtained center of the first wafer with the ideal positioning center to obtain a biasing vector of the first wafer center from the ideal positioning center; and adjusting the positioning position of the second wafer during the thin film process according to the vector.

4. The method of claim 1, wherein the radius direction is a direction from the center toward the periphery of the first wafer, and the radius direction comprises multiple radius directions formed by plural points set on the wafer periphery with an equal interval between these points.

5. The method of claim 2, wherein the position having a distance from the first wafer center with a radius direction comprises multiple positions set on the radius direction with an equal interval between each other in each radius direction.

6. The method of claim 1, wherein the thin film process comprises an epitaxy process and/or a deposition process.

7. A semiconductor manufacturing apparatus, which is applied to a thin film process, comprising:

a wafer carrier for carrying a wafer during the thin film process; and a positioning device for positioning the wafer at an ideal positioning center on the wafer carrier, and comprising a processor and an executable program instruction, wherein the positioning device performs the method of claim 1 when the processor performs the executable program instruction.

8. The apparatus of claim 7, further comprising a transferring device for transferring the wafer to the wafer carrier; wherein, in the Step S2, the step to adjust the positioning position of the second wafer according to the state distribution of the first surface comprises adjusting the transferring device according to the state distribution of the first surface.

* * * * *